United States Patent [19]

Edlin et al.

[11] Patent Number: 4,546,358
[45] Date of Patent: Oct. 8, 1985

[54] LARGE BROADBAND FREE RADIATING ELECTROMAGNETIC TEST CELL

[75] Inventors: George R. Edlin, Huntsville; Thomas H. Shumpert, Auburn; Brian R. Strickland, Lacy Springs, all of Ala.

[73] Assignee: The United States of America as represented by the Secretary of the Army, Washington, D.C.

[21] Appl. No.: 572,030

[22] Filed: Jan. 19, 1984

[51] Int. Cl.⁴ ............................................ H01Q 11/04
[52] U.S. Cl. .................................... 343/703; 343/739
[58] Field of Search ................ 343/703, 739, 740, 908

[56] References Cited

U.S. PATENT DOCUMENTS 4,218,683 8/1980 Hemming .......................... 343/703

Primary Examiner—Eli Lieberman
Attorney, Agent, or Firm—Anthony T. Lane; Robert P. Gibson; Robert C. Sims

[57] ABSTRACT

This disclosure sets forth a device which produces uniform electromagnetic fields in the medium frequency (MF) and high frequency (HF) regimes over significantly large test volumes. The device converts electromagnetic energy available from a standard radio-frequency transmitter into a vertically polarized uniform electromagnetic field which propagates through a large open region and is dissipated/radiated at the termination. A broadband (MF and HF) electromagnetic radiation over a large test volume is provided.

5 Claims, 1 Drawing Figure

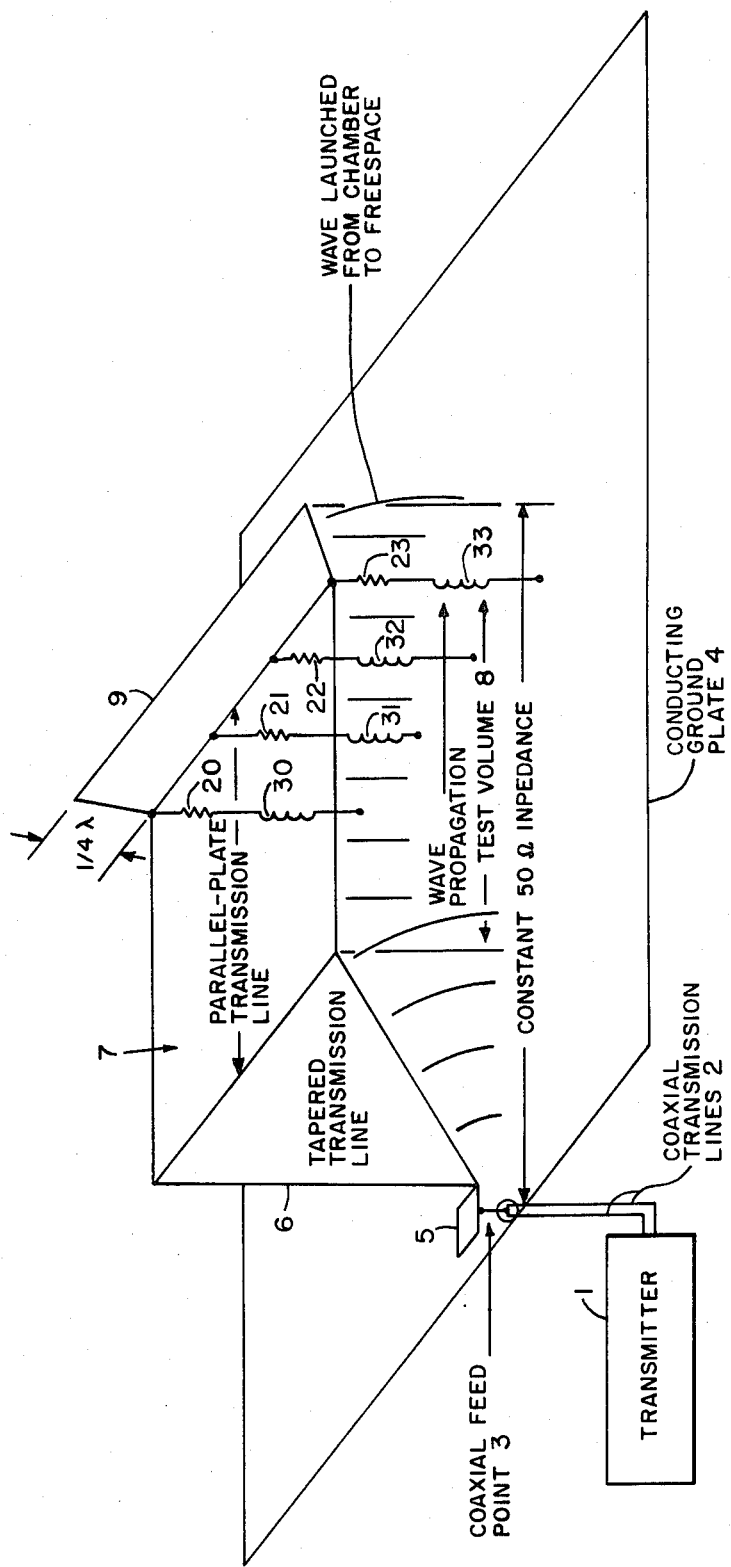

LARGE BROADBAND FREE RADIATING ELECTROMAGNETIC TEST CELL

DEDICATORY CLAUSE

The invention described herein may be manufactured, used, and licensed by or for the Government for governmental purposes without the payment to us of any royalties thereon.

BACKGROUND OF THE INVENTION

In current technology, generation of electromagnetic field environments for testing large military and civilian systems (aircraft, vehicles, building enclosures, etc.) has a pronounced deficiency in the Medium Frequency (MF) and High Frequency (HF) regimes. This deficiency is due in part to the fundamental nature of electromagnetic wave propagation and radiation. Existing techniques for generating these environments may be placed in two fundamental categories: bounded-wave structures and radiating-wave structures.

Bounded-wave structures utilize transmission lines to produce a uniform, high-intensity electromagnetic field environment which is necessarily confined to regions within the transmission line structure. Consequently, existing bounded-wave structures are often too small to accommodate the desired test objects in the MF and HF regimes.

Radiating-wave structures, on the other hand, utilize the propagating emission of electromagnetic waves to illuminate the test object in a specified electromagnetic field environment. Although large test objects may be illuminated in this manner, the field uniformity is significantly degraded by the dispersive nature of a radiating wave.

This disclosure sets forth a device for generating electromagnetic field environments over large test volumes in the MF and HF regimes. This device utilizes a hybrid scheme which incorporates advantages of both bounded-wave structures and radiating-wave structures.

SUMMARY OF THE INVENTION

A broadband, uniform amplitude, vertically polarized radio frequency (rf) field environment is established over a large test volume (or cell) in the Medium Frequency (MF) and High Frequency (HF) regimes as required by electromagnetic radiation hazards (EMRH) and electromagnetic radiation operational (EMRO) testing. This field environment is produced by a hybrid system which combines the properties of a bounded-wave transverse electromagnetic (TEM) transmission line terminated in a resistively-loaded, pseudo-TEM radiating horn antenna. The electromagnetic waves in the MF band are bonded by the TEM transmission line and terminated in the load resistors. The electromagnetic energy in the HF band is guided by the TEM transmission line and then radiated away by the pseudo-TEM radiating horn antenna. A judicious choice of terminating resistors and radiating horn flair will provide a non-reflective frequency-transition, broadband termination resulting in a uniform field environment heretofore not available for large test volumes in this two-decade frequency range.

BRIEF DESCRIPTION OF THE DRAWING

The single FIGURE is a diagrammatic illustration of the present invention.

DESCRIPTION OF THE BEST MODE AND PREFERRED EMBODIMENT

Electromagnetic energy in the MF and HF bands is supplied by a standard high-power radio frequency (RF) transmitter 1 through an appropriate coaxial transmission line 2 to the coaxial feed point 3. The electrical and geometrical configuration of the conducting ground plane 4 and parallel conducting feed plane 5 is such as to impedance match the coaxial transmission line 2. A tapered transmission line 6 with constant width-to-height (height is measured from the ground plane 4) ratio maintains the constant transmission line impedance while expanding both the vertical and horizontal area under the transmission line. When a predetermined height (related to the frequency range of operation and desired test volume) has been reached, this tapered section changes to a constant width, constant height, constant impedance parallel-plate transmission line 7. The desired test volume 8 is the open region between the top parallel plate 7 and the conducting ground plane 4. Due to the nature and characteristic operation of a transmission line, the electromagnetic field propagating through the test volume 8 should be a uniformly distributed quantity. If this parallel-plate transmission line 7 could be continued spatially to the right indefinitely, the enclosed field would be quite uniform. However, some form of termination is required. The key to the success of this device for its unusually broadband of operation lies in the hybrid termination (resistors 20-23, inductors 30-33 and a flare width extension). This hybrid termination prevents energy from being reflected back to the left along the transmission line by both dissipation and radiation effects. Reflected energy would set up standing waves thus destroying the desired field uniformity. The lower frequency (MF) energy is simply resistively dissipated by placing a course array of non-inductive resistors 20-23 of appropriate resistance values so as to "match" the parallel-plate transmission line impedance. At the higher frequencies (HF), the electromagnetic energy is allowed to simply radiate from the open aperture at the termination. A slight flare 9 in both the horizontal and vertical planes of the transmission line enhances this desired radiation. The length flared is about ¼ wavelength at mid HF. This flare will act as a radiating horn for passing the radiation without reflecting. The inductors 30-33 will improve the performance of the hybrid load at the transition frequencies in the upper MF band and the lower HF band.

We claim:

1. A broadband uniform electromagnetic field environment producing system comprising first and second parallel-plate transmission line elements adapted to be connected to an electromagnetic generating device at one end; said first transmission line element being a large conducting ground plane; said second transmission line element being spacially located parallel to said first element whereby the electromagnetic field environment is produced between first and second elements; a plurality of resistors connected to the other end of said second element and to said first element so as to act as termination loads to a band of frequencies in the lower range of the broadband electromagnetic field produced;

and a horn element connected to said other end of said second transmission line element for allowing an upper band of frequencies of said broadband electromagnetic field to be transmitting out of the environment.

2. A system as set forth in claim 1 wherein said horn element is a flared extension of said second transmission line element in both a horizontal and vertical plane with respect to a plane that said second transmission line is located in.

3. A system as set forth in claim 2 wherein said flared extension is of a length approximately ¼ of a wave length of the mid frequency of the upper band.

4. A system as set forth in claim 3 further comprising a tapered transmission line extension at the one end of said transmission line element for connecting to the generating device; and said transmission lines being constructed such that a constant impedance is maintained.

5. A system as set forth in claim 4 wherein said resistors are designed to have inductive properties for properly terminating the upper part of the lower band and the lower part of the upper band of electromagnetic field frequencies.

* * * * *